(12) United States Patent
Davis et al.

(10) Patent No.: US 8,067,314 B2
(45) Date of Patent: Nov. 29, 2011

(54) GATE TRIM PROCESS USING EITHER WET ETCH OR DRY ETCH APPROACH TO TARGET CD FOR SELECTED TRANSISTORS

(75) Inventors: Bradley M. Davis, Fukushima-ken (JP); Jihwan Choi, San Mateo, CA (US); Angela T. Hui, Fremont, CA (US)

(73) Assignee: Spansion LLC, Sunnyvale, CA (US)

( * ) Notice: Subject to any disclaimer, the term of this patent is extended or adjusted under 35 U.S.C. 154(b) by 148 days.

(21) Appl. No.: 12/424,023

(22) Filed: Apr. 15, 2009

(65) Prior Publication Data

US 2010/0264519 A1    Oct. 21, 2010

(51) Int. Cl.
*H01L 21/76* (2006.01)
(52) U.S. Cl. .............. 438/717; 438/707; 257/E21.215
(58) Field of Classification Search .......... 438/707, 438/717; 257/618, E21.215
See application file for complete search history.

(56) References Cited

U.S. PATENT DOCUMENTS

| 7,687,339 B1 * | 3/2010 | Schultz et al. ............. 438/197 |
| 2008/0233746 A1 * | 9/2008 | Huang et al. ............. 438/689 |

* cited by examiner

*Primary Examiner* — Matthew Reames
(74) *Attorney, Agent, or Firm* — Turocy & Watson, LLP

(57) ABSTRACT

Disclosed are methods and devices for targeting CD of selected transistors in a semiconductor device. Varying CD is done by forming hard mask lines in a hard mask layer that have varying amounts of spacer material associated therewith. Hard mask lines corresponding to selected transistors are either left covered or uncovered by a resist applied over the hard mask layer. Then, spacer material is selectively removed from the hard mask lines to vary the width of hard mask lines and associated side wall spacers. A gate layer is then etched through the spaces in the hard mask lines to form gate lines having varying widths and targeted CD.

20 Claims, 14 Drawing Sheets

GATE TRIM PROCESS USING EITHER WET ETCH OR DRY ETCH APPROACH TO TARGET CD FOR SELECTED TRANSISTORS

TECHNICAL FIELD

This disclosure describes device and methods for forming semiconductor devices having transistors with targeted CD.

BACKGROUND

The trend in semiconductor devices is toward higher circuit density with higher numbers of transistors per device, lower operating voltages, and higher access speeds. To achieve these high densities there have been, and continue to be, efforts toward scaling down device dimensions.

Miniaturization of semiconductor devices necessitates a greater density of transistors to be placed in the same area by shrinking the size of individual components. The basic components of a transistor are a source and drain regions separated by a channel, where a gate is placed over the channel to control channel conductance. In such an arrangement, the width of the gate line is a limiting parameter of the channel width. The width of the gate line is often referred to as the critical dimension (CD) and influences the number of transistors that can be made to fit within a fixed area.

The most common technique for patterning each of the individual gate lines upon a semiconductor wafer is projection photo-lithography. A light-sensitive photoresist is placed upon a semiconductor wafer, which may have a device layer formed thereon. Light from a light source passes through a partially transparent pattern formed on a reticle (also known as a photomask), resulting in exposed and unexposed areas being formed on the photoresist, thereby transferring the pattern to the photoresist. A series of etching steps are then employed to transfer the pattern formed on the photoresist to a conductive layer that will become the individual transistor gates.

SUMMARY

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

Those skilled in the art will recognize that well-known semiconductor fabrication techniques including depositing semiconductor materials, masking, photolithography, etching, and implanting are useful in forming the described devices. Deposition of semiconductor materials can be by low pressure chemical vapor deposition, chemical vapor deposition, atomic layer deposition, and the like. Conserved reference numbers match like elements.

Devices and methods are disclosed herein for semiconductor precursor devices having multiple, varying lines formed in a hard mask layer with associated spacer material. A semiconductor precursor device refers to a device having an unetched gate layer wherein the pattern for the to-be etched gate line pattern is formed within a hard mask layer formed over the gate layer. Upon etching of the gate layer, gate lines with varying CD are formed.

Varying gate line CD is formed by removing all or a portion of a spacer material associated with the hard mask lines formed over the gate layer. Hard mask lines corresponding to transistors for which a smaller CD is not desired are covered by a resist while hard mask lines corresponding to transistors for which a smaller CD is desired are not covered by a resist. The semiconductor precursor device with resist thereon is then subjected to a wet etch process or a dry etch process. The wet etch process removes a portion of the spacer material associated with hard mask lines for the semiconductor precursor devices not protected by a resist. After this wet etch step, the resist is removed and the spacer material is etched, usually with a dry etch process, to form sidewall spacers. After the spacer etch, there is an additional masking step, and then a dry etch removes substantially all the spacer sidewall material associated with semiconductor device precursor not protected by a resist. It is also possible to combine the above two approaches. In this approach, the masking and wet etch steps described above is used before the spacer etch step to reduce the effective hard mask line thickness of some semiconductor device precursor. Then after the spacer etch step, there is a second masking step and an additional dry etch step to remove substantially all of the spacer sidewalls from other semiconductor device precursor.

The result is that at least one hard mask lines is formed upon the semiconductor device precursor, wherein the total width of the hard mask line plus the width of the associated spacer material is substantially different from the total width of another hard mask line plus the width of its associated spacer material. An alternative description is that the width of the spacer material associated with at least one of the hard mask lines is substantially different from the width of spacer material associated with another hard mask line. The gate layer is then etched by contacting the gate layer with etchant.

One aspect of the invention relates to a semiconductor device precursor having hard mask lines formed thereon allowing for gate lines having varying widths to be etched onto the semiconductor device at a later time. The device has a hard mask layer formed over a gate material layer, wherein the hard mask layer is formed into a plurality of hard mask lines, and spacer material associated with the plurality of hard mask lines. The device is further characterized by having at least one of the plurality of hard mask lines associated with spacer sidewalls having a width substantially different from the width of spacer sidewall associated with another hard mask line and/or at least one of the plurality of hard mask lines not associated with spacer sidewall.

Another aspect of the invention relates to a method for forming a semiconductor device having gate lines with varying widths and targeted CD. A dry etch process is performed on a semiconductor device having a hard mask layer formed over a gate material layer, wherein the hard mask layer is formed into a plurality of hard mask lines, and a layer of spacer material formed over the plurality of hard mask lines. A first portion of the plurality of hard mask lines is covered by a resist. Then, a wet etch process is performed on the semiconductor device removing a portion of the deposited spacer material. The resist is then removed. A dry etch process then removes a portion of the spacer material and the remaining spacer material adheres to the sides of the plurality of hard mask lines. The width of the sidewall spacers are wider for the devices covered by resist during the previous wet etch than the devices exposed to the wet etch. Next, the gate material layer is etched using the hard mask plus sidewall spacers as a template to form gate lines.

Yet another aspect of the invention relates to the above-described method, where the wet etch process is replaced with a dry etch process, wherein substantially all of the associated spacer material is removed from hard mask lines not covered by the resist. In this process after the spacer material is deposited, there is a dry etch to form the sidewall spacers. Then, a portion of the plurality of hard mask lines is covered by a resist. There is then an additional dry etch step to remove substantially all of the associated spacer material for devices not covered by resist. The resist is then removed, and next, the gate material layer is etched using the hard mask lines plus sidewall spacers, if still present, as a template to form gate lines.

Still yet another aspect of the invention relates to the combination of the above two described methods. A dry etch process is performed on a semiconductor device having a hard mask layer formed over a gate material layer, wherein the hard mask layer is formed into a plurality of hard mask lines, and a layer of spacer material formed over the plurality of hard mask lines. A first portion of the plurality of hard mask lines is covered by a resist. Then, a wet etch process is performed on the semiconductor device removing a portion of the deposited spacer material. The resist is then removed. A dry etch process then removes a portion of the spacer material and the remaining spacer forms sidewall spacers adhered to the sides of the plurality of hard mask lines. The width of the spacer sidewall is wider for the devices covered by resist during the previous wet etch than the devices exposed to the wet etch. Then, a second portion of the plurality of hard mask lines is covered by a resist. Then, there is an additional dry etch step to remove substantially all of the associated spacer material for devices not covered by resist. Next, the gate material layer is contacted with an etchant using the hard mask plus sidewall spacers as a template to form gate lines. The semiconductor precursors covered by resist before both the additional wet and dry etch will have the widest CD, the ones covered by resist during the dry etch, but exposed to the wet etch will have a smaller CD, and the precursors exposed to the additional dry etch will have the smallest CD.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detained description of the invention when considered in conjunction with the drawings.

DETAILED DESCRIPTION

Figure 1:
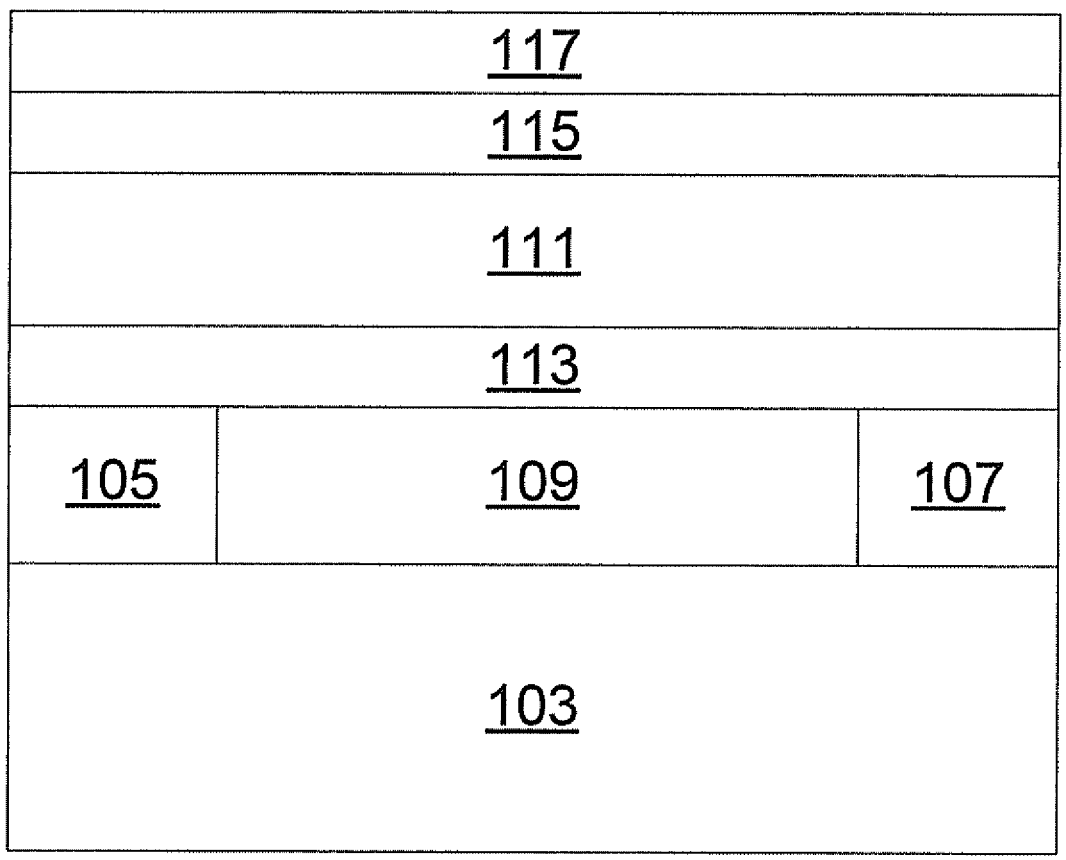
FIG. 1 is a cross-sectional illustration of an exemplary device in accordance with an aspect of the subject invention.

The innovation is now described with reference to the drawings, wherein like reference numerals are used to refer to like elements throughout. In the following description, for purposes of explanation, numerous specific details are set forth in order to provide a thorough understanding of the innovation. It may be evident, however, that the innovation can be practiced without these specific details. In other instances, well-known structures and devices are shown in block diagram form in order to facilitate describing the invention. Throughout this disclosure, like reference numbers refer to like elements throughout the Figures of the disclosure.

FIG. 1 shows a semiconductor device precursor prior to etching of a gate dielectric layer and/or hard mask layer thereon. In a typical semiconductor device 101, a source 105 and drain 107 are formed on the semiconductor substrate 103 via doping. In a typical device, the source 105 and drain 107 are formed by n-type doping, and a channel 109 is formed between the source 105 and drain 107 having p-type doping. However, the pattern of doping can be reversed, where the source 105 and drain 107 are formed from p-doped regions and the channel 109 is formed from n-doped regions.

A gate is formed over the channel 109 to modulate conductivity through the channel 109. The gates are formed from a layer of gate material 111, typically doped polysilicon, formed over the semiconductor device. An insulation layer 113 (high dielectric material) can separate the gate layer 111 from the channel 109. The gate layer is etched to form the individual gates associated with each transistor. The widths of the gates determine the CD of the transistors and govern the quantity of transistors that can be formed in a given area.

Typically, a hard mask dielectric layer 115 is placed over the polysilicon layer 111. A photoresist 117 is placed over the hard mask layer 115. The individual gates are formed by transferring a pattern first to the photoresist 117 through lithographic techniques, including exposure and development of the photoresist 117, and then to the hard mask layer 115 through an etching process. In a positive resist, the light exposed areas of the photoresist 117 are removed after development to expose portions of the hard mask layer 115 while other portions of the hard mask layer 115 are not exposed. In a negative resist, unexposed areas of the photoresist 117 are removed following development. Following development of the photoresist 117, the hard mask layer 115 is selectively contacted with an etchant through the developed photoresist 117. Etching the hard mask layer 115 forms the gate pattern in the hard mask layer 115. The etched hard mask layer 115 forms a plurality of hard mask lines 119, with portions of the gate layer 111 exposed in the areas between the hard mask lines 119.

In many semiconductor devices, having at least two sets of gates, with varying CD, is desirable for various applications. This is particularly true where one integrated circuit has multiple functionalities. For example, an integrated circuit can contain transistors forming part of a memory array and transistors forming part of a memory control circuit, where varying gate widths are desired depending upon the function of the transistor.

Figure 2:
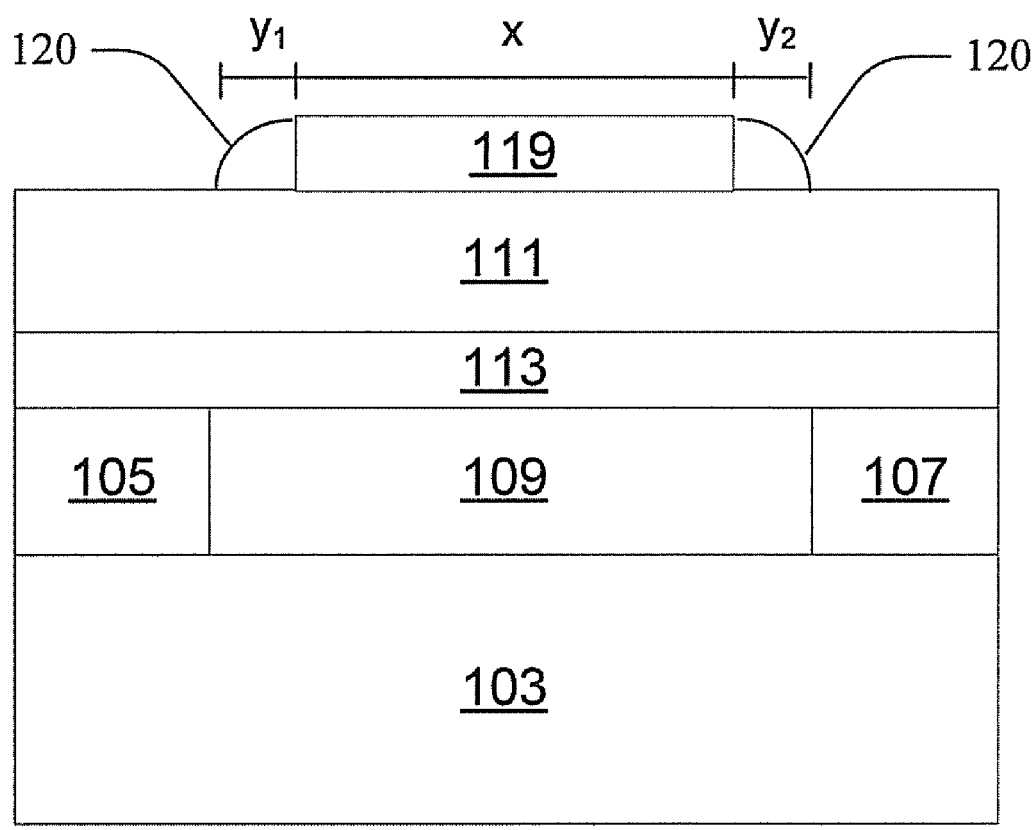
FIG. 2 is a cross-sectional illustration of an exemplary device with a hard mask line with associated spacer sidewalls formed thereon in accordance with an aspect of the subject invention.

Spacer material is deposited upon the etched hard mask layer 115 prior to etching of the gate layer 111; excess spacer material is removed by a dry and/or etch process such that spacer material is only adhering to the sides of the hard masker lines 119 to form sidewall spacers 120. As shown in FIG. 2, the final CD for each transistor is defined by the width of the hard mask lines, shown as dimension x, plus the total width of the sidewall spacers associated with the hard mask line (shown as dimensions $y_1$ and $y_2$). That is, the width of the hard mask lines 119 plus the total width of associated sidewall spacers 120, as the sum of x, $y_1$ and $y_2$, determines the width of the gate lines following etching of the gate layer 111. The dimensions x, $y_1$, and $y_2$ are measured along the lower portion toward the semiconductor substrate 103.

The innovations disclosed herein are directed toward the transfer of two or more different gate line widths to the gate layer 111. A semiconductor device is formed having a plurality of hard mask lines; the hard mask lines can have substantially equal widths or can differ in width. At least a portion of the plurality of hard mask lines is associated with sidewall spacers. For at least one of the plurality of hard mask lines, the sum of the widths of the hard mask line and associated sidewall spacers is substantially different from the width of another hard mask line and associated sidewall spacers. The widths of the hard mask lines and associated sidewall spacers for each set of hard mask lines controls the width of the gate lines formed in the gate layer 111 following etching of the gate layer 111.

The terms "width of spacer material," "spacer material having a width," and other terms relating to the width of spacer material associated with hard mask lines is herein defined throughout this disclosure as the sum total width of spacer material associated with both sides of a hard mask line. In reference to FIG. 2, the width of spacer material is the sum of largest dimension $y_1$ and $y_2$ of spacer material adhering to both sides of the hard mask line. It is possible for the dimensions $y_1$ and $y_2$ to have different values.

The term "set of hard mask lines" is herein defined throughout this disclosure as hard mask material remaining to form hard mask lines after etching of a hard mask, wherein a set of hard mask lines remaining after etching has a substantially similar width of sidewall spacers associated with the remaining hard mask lines. A set of hard mask lines may be characterized by having associated sidewall spacers with a width about zero.

The term "sidewall spacers" is herein defined throughout this disclosure as the spacer material adhering to the sides of a hard mask line, wherein the side of a hard mask line is defined as the surface of a hard mask line that is substantially perpendicular the surface of the semiconductor substrate upon which device structures are built. The expressions "spacer sidewalls" and "spacer material associated" with a hard mask line are herein defined as synonymous expressions construed to have the same meaning.

Terms, such as "on," "above," "below," and "over," used herein, are defined with respect to the plane parallel of the surface of the semiconductor substrate. The terms "on," "above," "over," etc., indicate that the subject element is farther away from the plane of the semiconductor substrate than another element referred to as a spatial reference. The term "below" and similar terms indicate that the subject element is closer to the plane of the semiconductor substrate than another element referred to as a spatial reference. References to the plane of the semiconductor substrate or plane of the semiconductor substrate is defined as a plane parallel to the surface of the semiconductor device upon which device elements are built. The preceding definitions apply throughout this document.

Wet Dip

Figure 3:
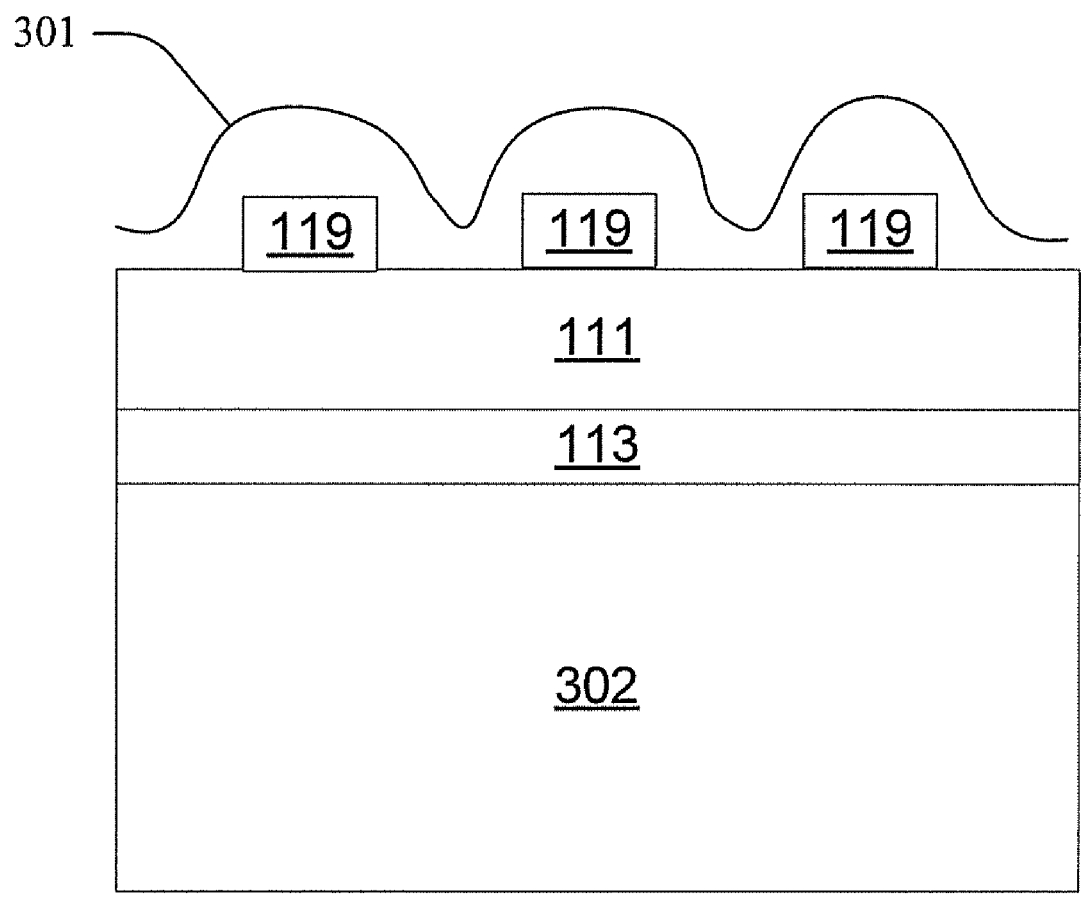
FIG. 3 is a cross-sectional illustration of an exemplary device with hard mask lines and a layer of spacer material formed thereon in accordance with an aspect of the subject invention.
Figure 4:
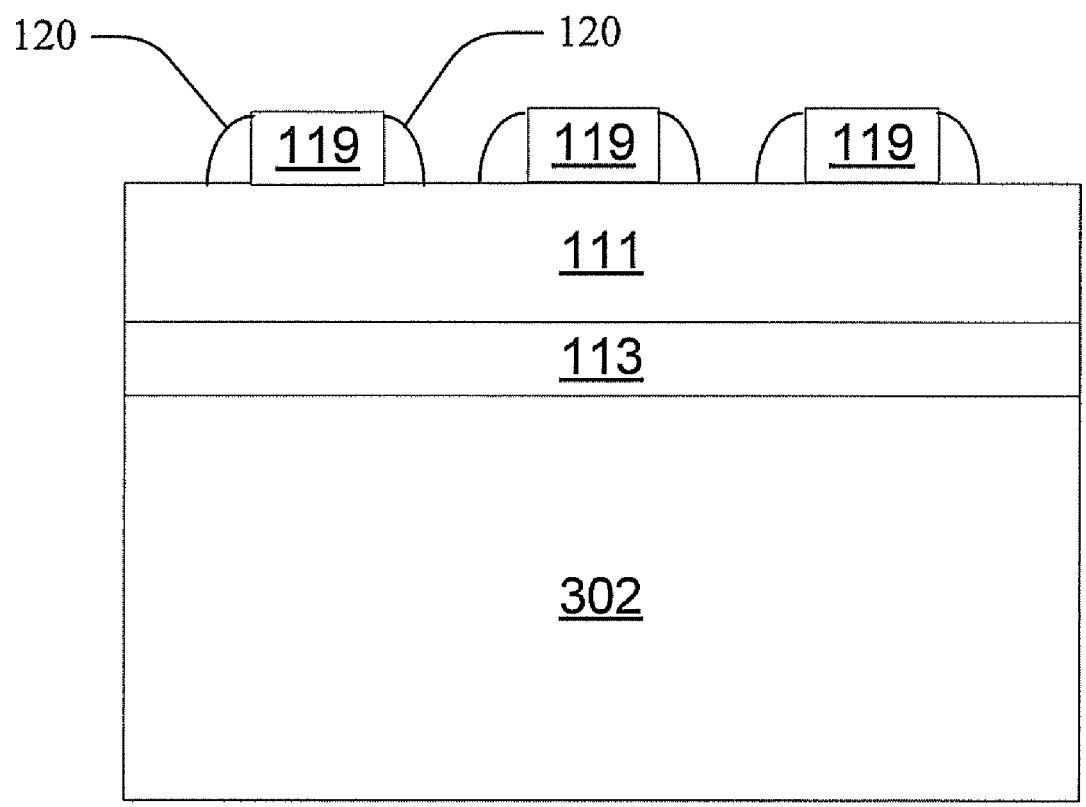
FIG. 4 is a cross-sectional illustration of an exemplary devise with hard mask lines with associated sidewall spacers formed thereon in accordance with an aspect of the subject invention.

With reference to FIGS. 3 through 7, devices and methods in accordance with aspects of the invention are described with particularity. In FIG. 3, a dielectric spacer material 301 is deposited over the etched hard mask lines 119. Elements of the semiconductor precursor device below the insulation layer 113 are not shown in detail (reference number 302). A dry etch, or chemical wet dip, can be used to remove excess spacer material from the region between the individual hard mask line structures 119, such that spacer material is adhering only to the sides of the hard mask lines 119 to form sidewall spacer 120, as shown in FIG. 4. At this point, it is feasible to etch the gate layer 111 through contact of the gate layer 111 with an etchant. Etching of the gate layer 111 forms a plurality of gate lines (not shown). The width of the lines transferred to the gate layer 111 in this manner will equal, or be correlated to, the width of the hard mask line 119 plus associated sidewall spacers 120.

Figure 5:
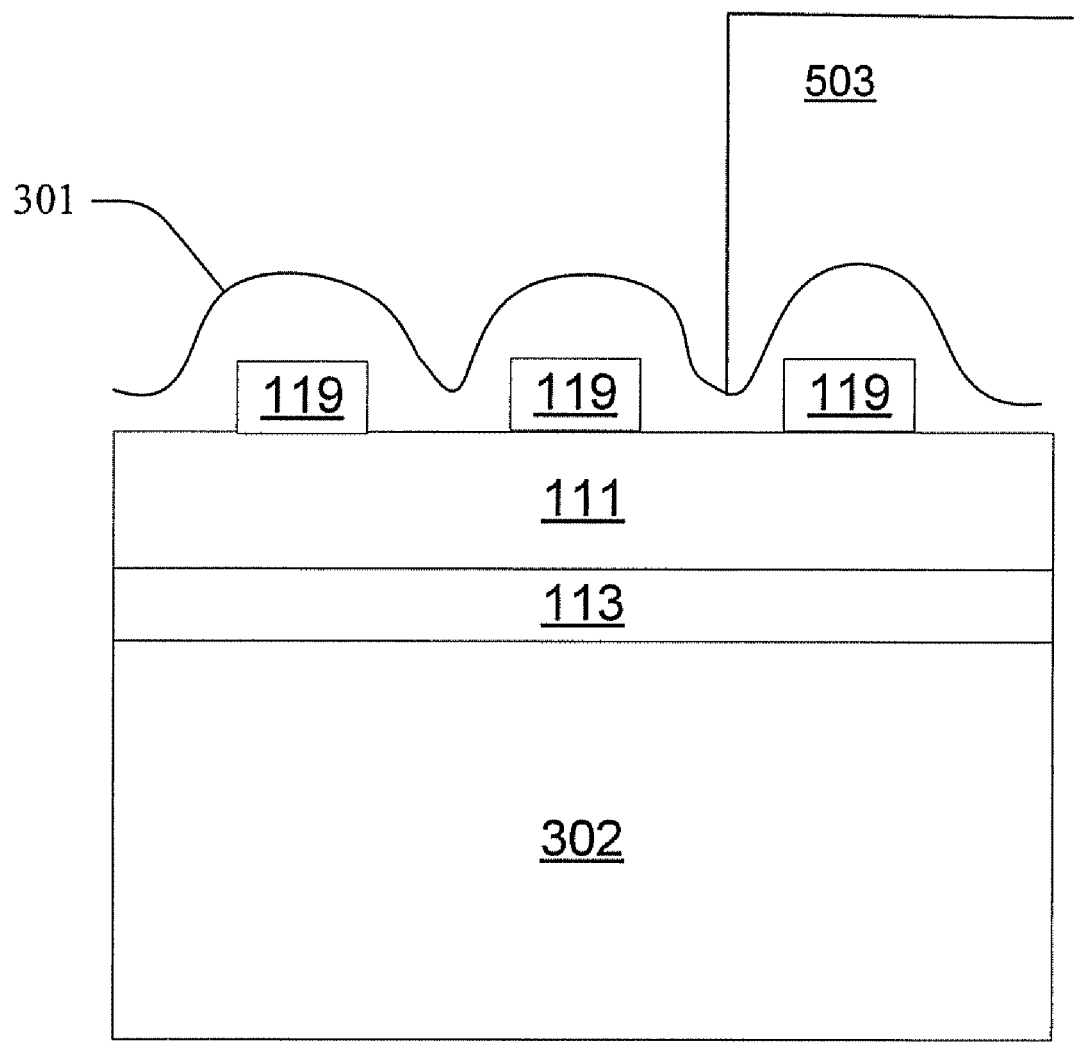
FIG. 5 is a cross-sectional illustration of an exemplary device with a hard mask lines with resist protecting the deposited spacer material in accordance with an aspect of the subject invention.
Figure 6:
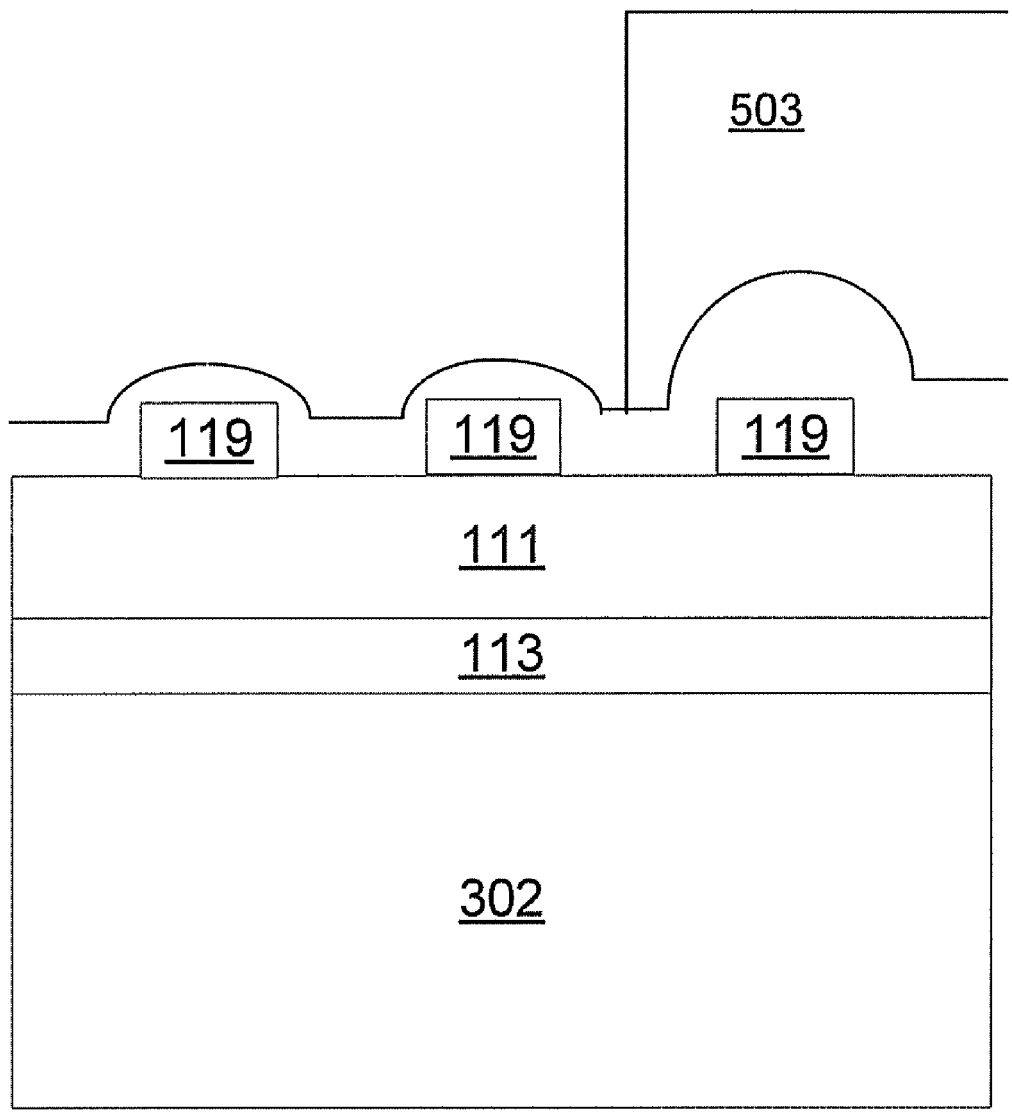
FIG. 6 is a cross-sectional illustration of an exemplary device with hard mask lines with a layer of spacer material formed thereon and a resist covering a portion of the hard mask lines following a wet etch step is accordance with an aspect of the subject invention.
Figure 7:
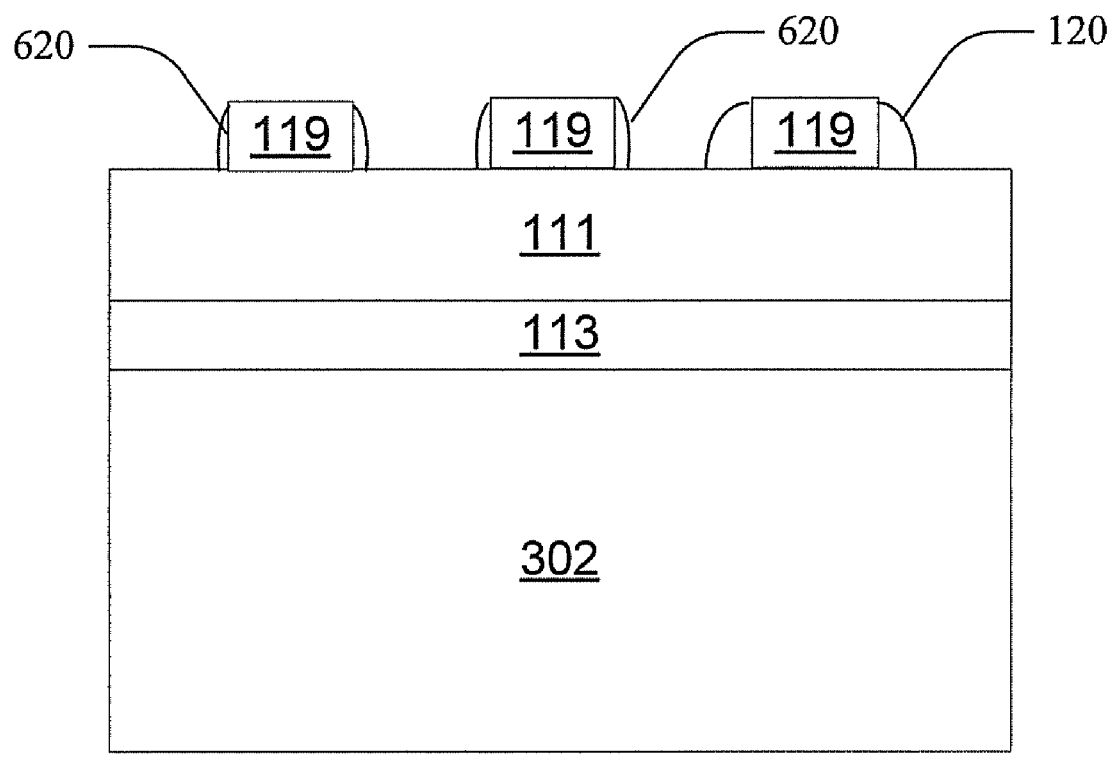
FIG. 7 is a cross-sectional illustration of an exemplary device with hard mask lines with associated spacer sidewalls of varying widths formed thereon in accordance with an aspect of the subject invention.
Figure 8:
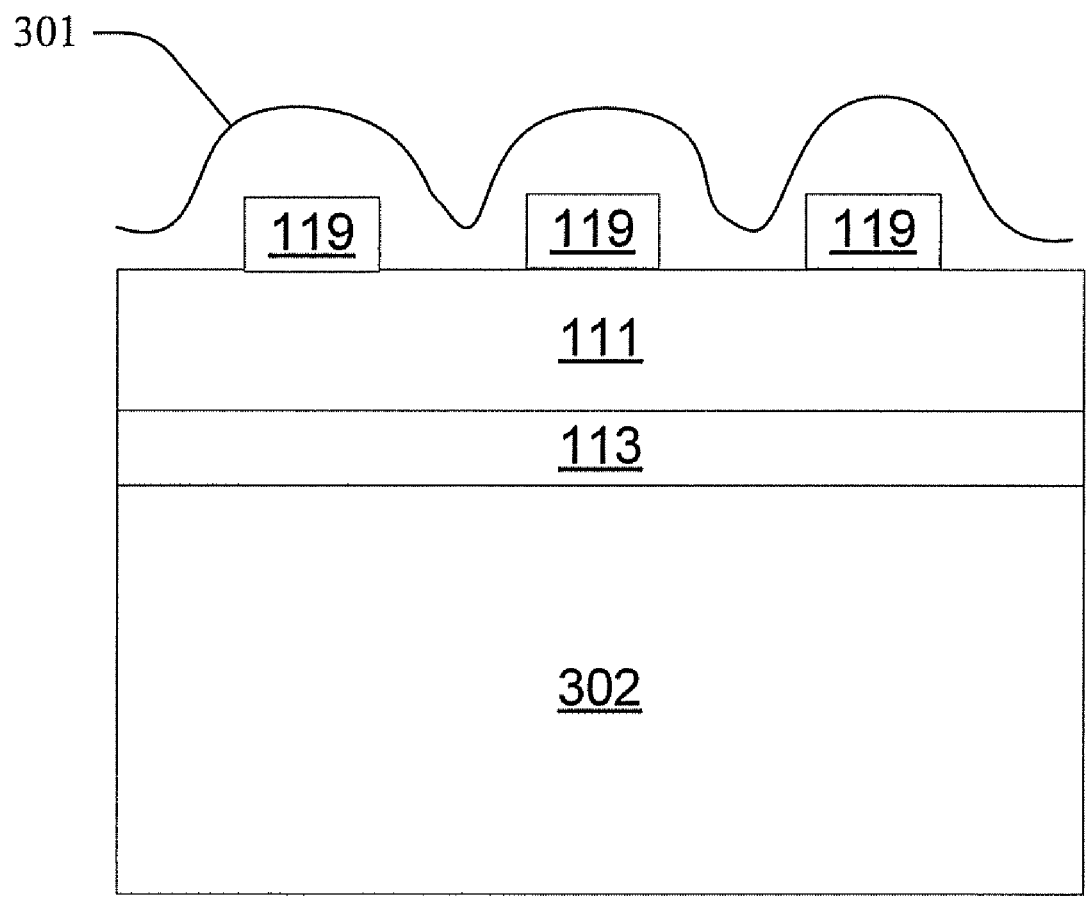
FIG. 8 is a cross-sectional illustration of an exemplary device with hard mask lines formed thereon and spacer material deposited thereon in accordance with an aspect of the subject invention.

An embodiment of the innovations disclosed herein is shown in FIG. 5. A resist 503 is placed over the hard mask lines 119 deposited with spacer material 301 corresponding to transistors for which a smaller CD is not desired. A wet etch is then performed such that partial amounts of spacer material 301 are removed from the hard mask lines 119 not covered by the mask 503. The resulting device is shown in FIG. 6. After the wet etch, the resist 503 is removed. The spacer material is then etched using a dry etch to create side wall spacers 120 and 620, as shown in FIG. 7. The spacer material that was not covered by the resist 503, and hence subject to the period of wet etching, is shown as reference numeral 620. The sidewall spacers 620 have a smaller width than sidewall spacers 120. The reduced width dimension of the sidewall spacers 620 as compared to sidewall spacers 120 is a function of the length and concentration of the wet etch performed while the resist 503 is in place. Hence, upon etching the gate layer 111, the pattern of a smaller CD is transferred to the gate layer 111 for gate lines corresponding to hard mask lines 119 associated with side wall spacers 620.

Dry Etch

Figure 9:
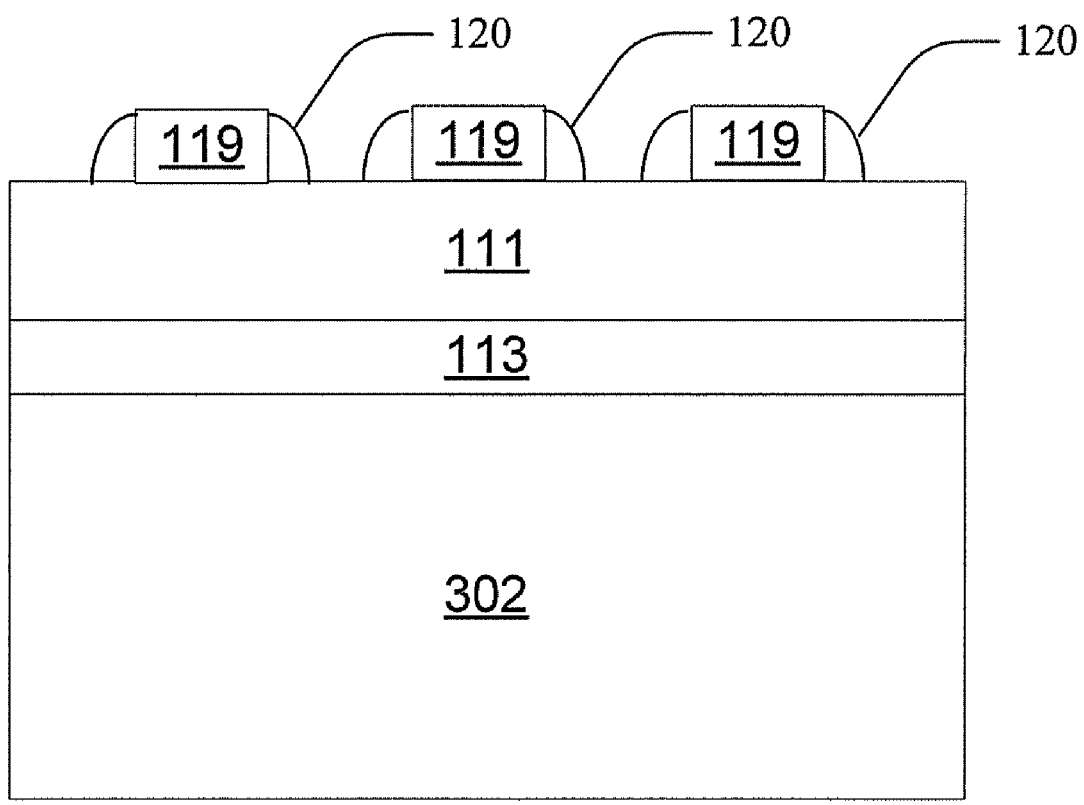
FIG. 9 is a cross-sectional illustration of an exemplary device with hard mask lines and formed spacer sidewalls thereon in accordance with an aspect of the subject invention.

With reference to FIGS. 8 through 11, devices and methods in accordance with an additional aspect of the invention are described with particularity. In reference to the device shown in FIG. 8, spacer material 301 is deposited over the etched hard mask lines. In FIG. 9 the spacer material 301 is then subjected to a dry etch process (plasma etch), wherein all the spacer material 301 is removed except for sidewall spacers 120 attached to the hard mask lines 119.

Figure 10:
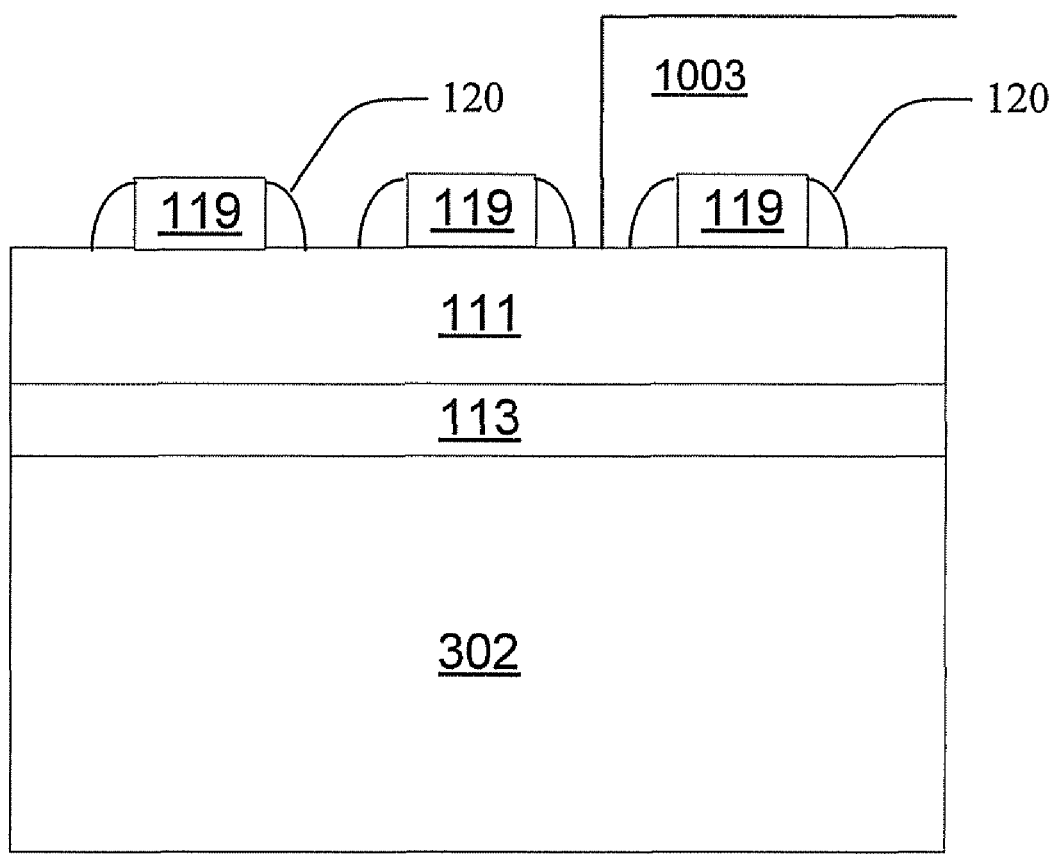
FIG. 10 is a cross-sectional illustration of an exemplary device with hard mask lines with associated spacer sidewalls and a resist formed thereon in accordance with an aspect of the subject invention.

With reference to FIG. 10, a resist layer 1003 is placed over the etched hard mask lines 119 and sidewall spacers 120. Those lines where a smaller CD is not required are protected by resist layer 1003 while those where smaller CD is required are not protected by resist layer 1003. Then, a dry etch process is used to substantially remove the sidewall spacers not protected by a resist. The resist layer 1003 is then removed.

Figure 11:
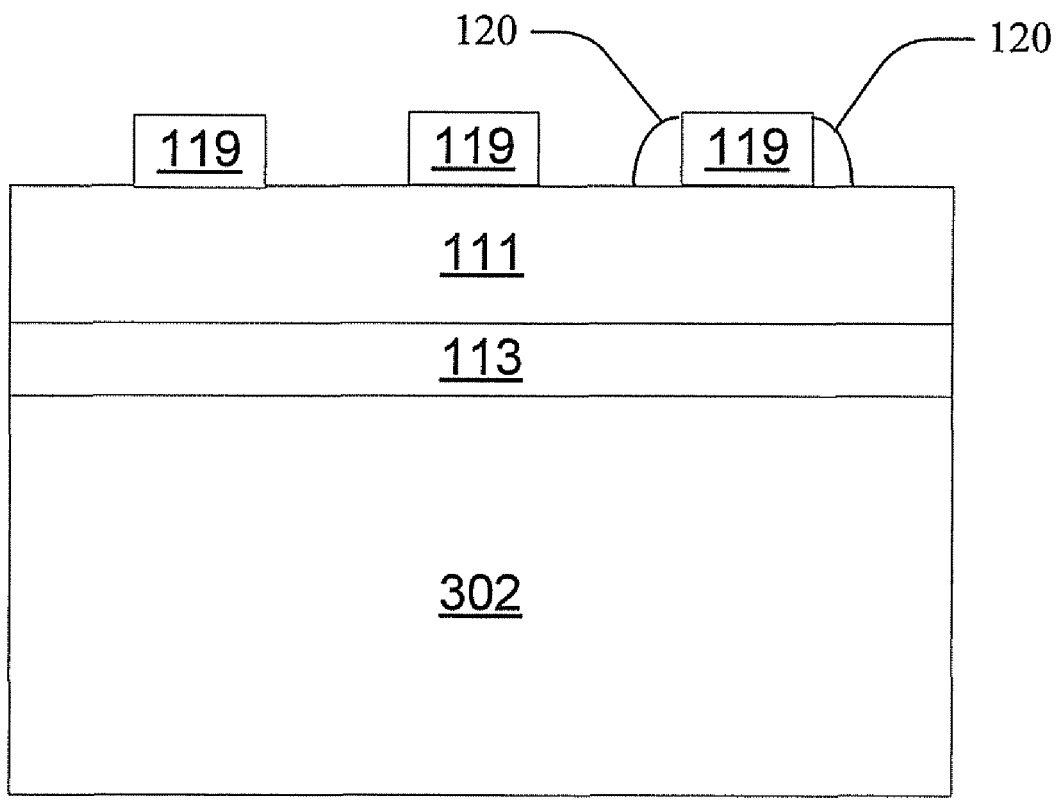
FIG. 11 is a cross-sectional illustration of an exemplary device with hard mask lines with associated spacer sidewalls formed and with some spacer sidewalls removed thereon in accordance with an aspect of the subject invention.

The resulting device is shown in FIG. 11. Upon etching the gate layer 111, the pattern of a smaller CD is transferred to the gate layer 111 for gate lines corresponding to hard mask lines 119 associated with no spacer material. That is, the CD of the transistors corresponding to hard mask lines 119 associated with no spacer material are defined by the lithographic process used to expose and develop the photoresist 117 used to etch the hard mask layer 115. The pattern of a larger CD for transistors corresponding to hard mask lines 119 associated with sidewall spacers 120 is determined by the dry etch process used to remove excess spacer material 301 prior application of resist 1203.

Wet and Dry Etch

With reference to FIGS. 3, 5-7 and 12-13, devices and methods in accordance with yet an additional aspect of the invention are described with particularity. In this approach the procedures described in Wet Etch section are followed to prepare the semiconductor precursor shown in FIG. 7.

Figure 12:
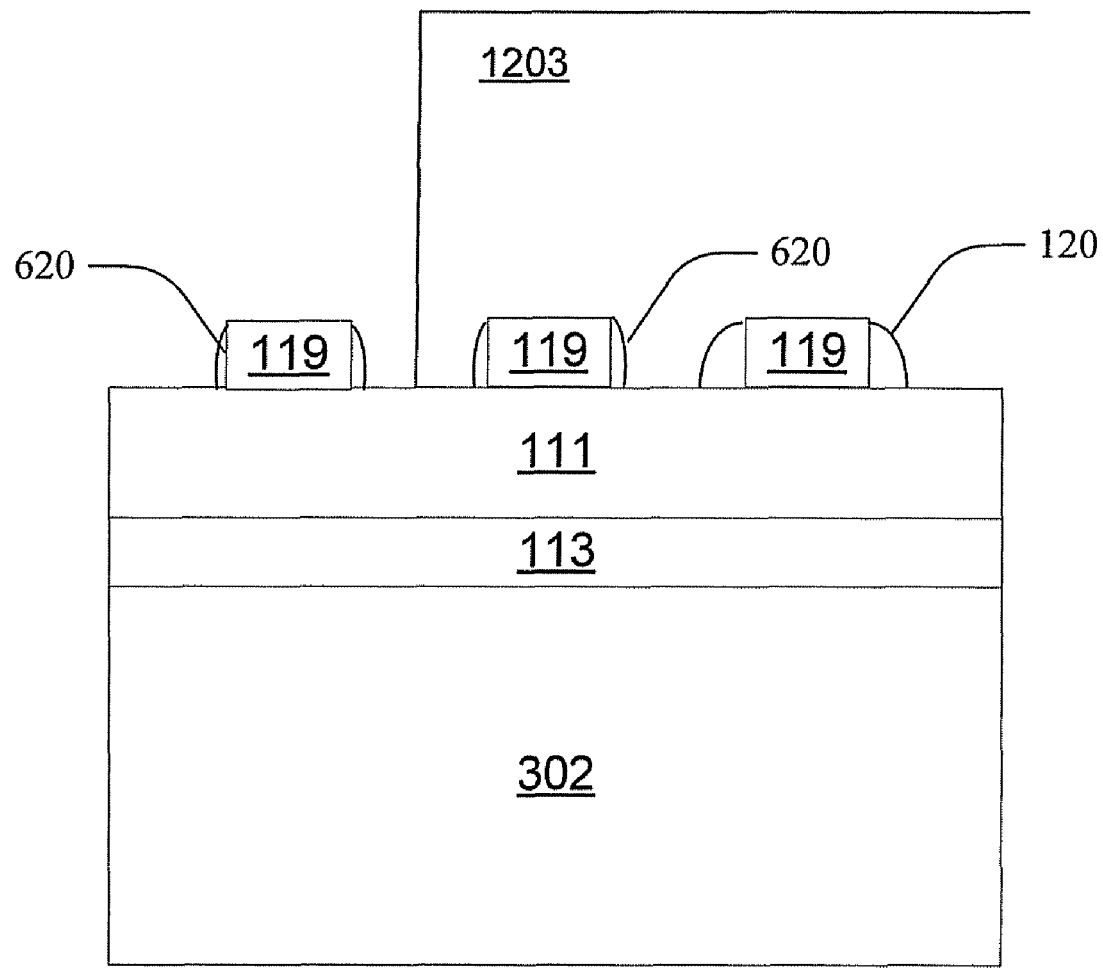
FIG. 12 is a cross-sectional illustration of an exemplary device with hard mask lines with associated spacer sidewalls formed thereon and a resist covering a portion of the hard mask lines in accordance with an aspect of the subject invention.
Figure 13:
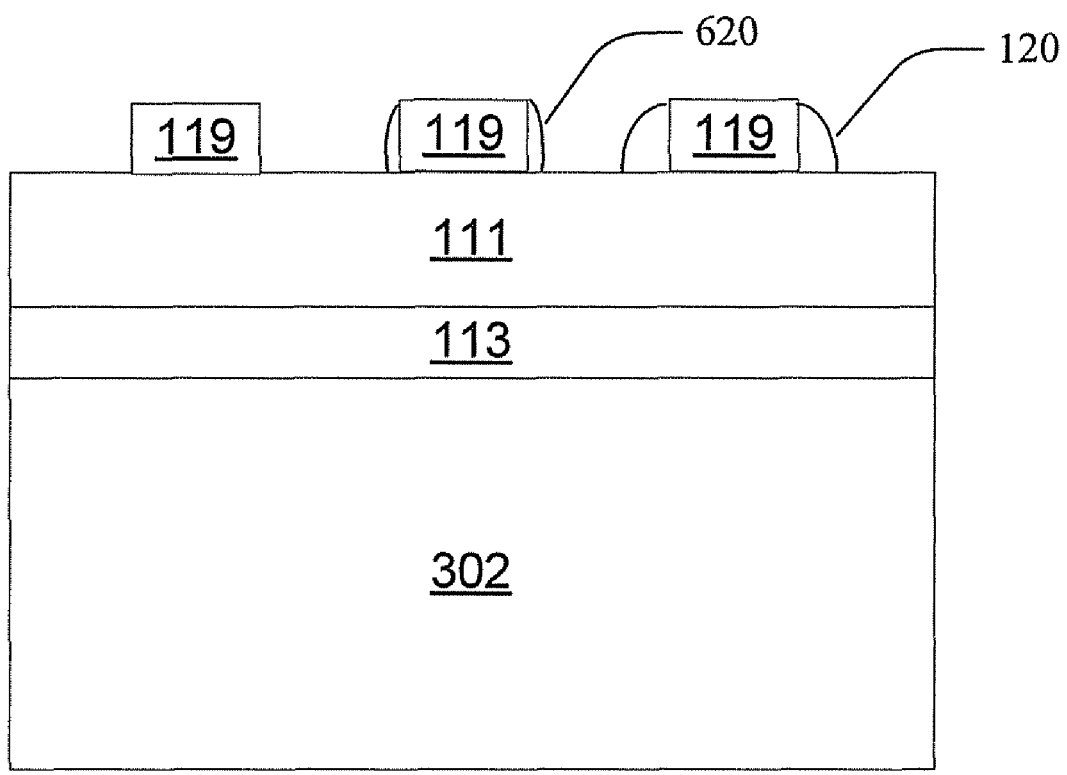
FIG. 13 is a cross-sectional illustration of an exemplary devise with hard mask lines with associated sidewall spacers formed with some hard mask lines not having associated side wall spacers in accordance with an aspect of the subject invention.

After the dry etch step to produce the sidewall spacers in FIG. 7, resist layer 1203 is used to protect a second portion of the hard mask lines, as shown in FIG. 12. The second portion of hard mask lines includes the portion of hard mask lines covered by resist 503 shown in FIG. 6. A dry etch is then used to remove the sidewall spacer from select semiconductor precursors, those not protected by resist layer 1203. After this dry etch step, the resist is removed. As shown in FIG. 13, semiconductor precursors with wider sidewall spacers labeled 120 are prepared as well as thinner sidewall spacers labeled 620 and finally semiconductor precursors with no sidewall spacers.

Performance of any one or more of the wet etch, dry etch, or wet and dry etch process described above produces a semiconductor precursor device having at least two sets of hard mask lines, where the difference between the at least two sets of hard mask lines is the width of the sidewall spacers associated with respective set of hard mask lines. The sum of the width of an individual hard mask line and the width of any associated sidewall spacer is determinative of the width of a gate line that will be transferred to the gate layer 111. As such, different embodiments of the semiconductor precursor devices and methods disclosed herein may be described by changes in the sum of the widths of side wall spacers and hard mask lines. In one embodiment of the subject invention, the sum of the width of at lest one hard mask line and associated sidewall spacer differs from the sum of the width of another hard mask and associated sidewall spacer by about 5 nm or more. In another embodiment of the subject invention, the sum of the width of at least one hard mask line and associated sidewall spacer differs from the sum of the width of another hard mask line and associated sidewall spacer from about 5 nm to about 35 nm. In yet another embodiment of the subject invention, the sum of the width of at least one hard mask line and associated sidewall spacer differs from the sum of the width of another hard mask line and sidewall spacer from about 10 nm to about 35 nm. In all of the preceding described embodiments, the sum of the width of a hard mask line and associated sidewall spacer includes a gate line where all associated spacer material has been removed by etching, wherein the width of a hard mask line and associated sidewall spacer substantially equals the width of the hard mask line.

Those skilled in the art will readily understand that it is feasible to form devices having hard mask lines of different widths formed within the hard mask layer 115. The methods and procedures described above are directed toward the use of various dry and/or wet etching steps to modify the width of sidewall spacers formed on the sides of hard mask lines. As such, different embodiments of the semiconductor precursor devices and methods disclosed herein may be described by changes in the widths of side wall spacers associated with different hard mask lines without regard to the width of any individual hard mask line.

In one embodiment, the width of sidewall spacers associated with at least one of the plurality of hard mask lines differs from the width of side wall spacers associated with another of the plurality of hard mask lines by about 5 nm or more. In another embodiment, the width of sidewall spacers associated with at least one of the plurality of hard mask lines differs from the width of side wall spacers associated with another of the plurality of hard mask lines from about 5 nm to about 35. In yet another embodiment, the width of sidewall spacers associated with at least one of the plurality of hard mask lines differs from the width of side wall spacers associated with another of the plurality of hard mask lines from about 10 nm to about 35 nm. In all of the preceding described embodiments, the difference between the widths of sidewall spacers includes comparison to hard mask lines wherein the width of the associated sidewall spacer is substantially zero due substantially all of the associated sidewall spacers being removed by a dry etch process.

The above describe wet and dry etch process can be used to form a semiconductor device having three or more different widths of gate lines formed in the gate layer 111. As discussed, at least one hard mask line is formed with wider associated sidewall spacers 120 and another hard mask line is formed with narrower associated sidewall spacers 620. A third hard mask line is formed with substantially all associated sidewall spacers removed. As such, different embodiments of the wet and dry etch process described above can be described by describing the difference in width between the wider sidewall spacers and the narrower sidewall spacers.

In one embodiment of the subject invention, the width of sidewall spacers associated with a first hard mask line is about 5 nm or more narrower than the width of sidewall spacers associated with a second hard mask line, wherein a third hard mask line has substantially no associated sidewall spacers. In another embodiment of the subject invention, the width of sidewall spacers associated with a first hard mask line is from about 5 nm to about 25 nm narrower than the width of sidewall spacers associated with a second hard mask line, wherein a third hard mask line has substantially no associated sidewall spacers. In yet another embodiment of the subject invention, the width of sidewall spacers associated with a first hard mask line is from about 5 nm to about 15 nm narrower than the width of sidewall spacers associated with a second hard mask line, wherein a third hard mask line has substantially no associated sidewall spacers.

Figure 14:
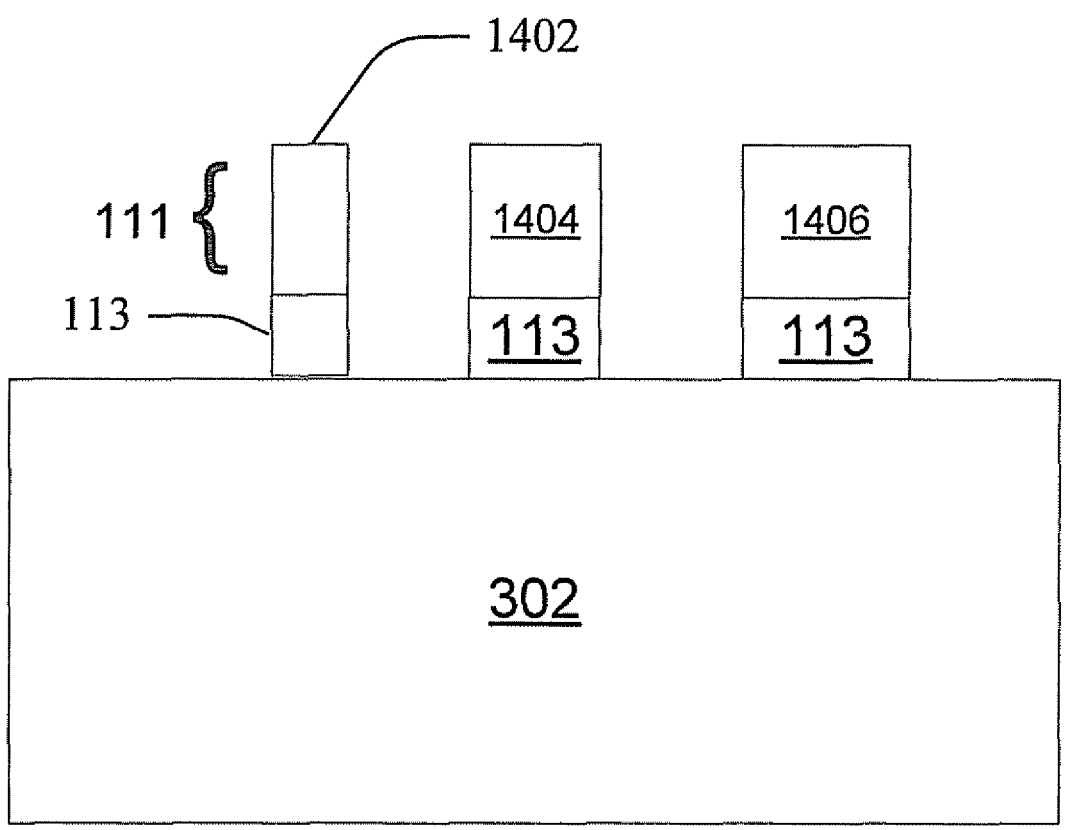
FIG. 14 is a cross-sectional illustration of an exemplary device with gate lines having varying CD formed in accordance with an aspect of the subject invention.

Those skilled in the art will readily recognize that a semiconductor device having gate material layer 111 etched into gates lines can be formed by contacting any of the described semiconductor device precursors with an etchant to remove portions of the gate material layer 111 and insulation layer 113, thereby transferring the pattern formed by the hard mask lines 119 and any associated sidewall spacers to the gate material layer 111. As an example, a semiconductor device formed from the semiconductor precursor device shown in FIG. 13 is presented in FIG. 14. As previously described, the device shown in FIG. 13 has hard mask lines 119 associated with sidewall spacers having varying widths 120 and 620 and/or with no spacer material. As shown in FIG. 14 following etching of gate material layer 111 and insulation layer 113, a gate line with a small width 1402, a gate line with an intermediate width 1404 and a gate line with a large width 1406 are formed. The difference in width between gate lines 1402, 1404 and 1406 are the same as any of the embodiments described above for differences in sidewall spacer widths.

What has been described above includes examples of the subject invention. It is, of course, not possible to describe every conceivable combination of components or methodologies for purposes of describing the subject invention, but one of ordinary skill in the art may recognize that many further combinations and permutations of the subject invention are possible. Accordingly, the subject invention is intended to embrace all such alterations, modifications and variations that fall within the spirit and scope of the appended claims. Furthermore, to the extent that the term "includes" and "involves" are used in either the detailed description or the claims, such terms are intended to be inclusive in a manner similar to the term "comprising" as "comprising" is interpreted when employed as a transitional word in a claim.

What is claimed is:

1. A method for forming a semiconductor device having transistors with targeted CDs, comprising:
   providing a semiconductor device comprising a hard mask layer formed over a gate material layer, wherein the hard mask layer is formed into a plurality of hard mask lines and a layer of spacer material formed over the plurality of hard mask lines;
   covering a first portion of the plurality of hard mask lines with a first resist;
   performing a wet etch process on the semiconductor device having the first portion of the plurality of hard mask lines covered with a first mask;
   removing the first resist from the first portion of the plurality of hard mask lines;
   performing a first dry etch process to remove a portion of the spacer material, wherein the remaining spacer material adheres to the sides of the plurality of hard mask lines to form sidewall spacers; and
   after performing the first dry etch, covering a second portion of the plurality of hard mask lines and associated spacer sidewalls with a second resist and performing a second dry etch to remove substantially all of sidewall spacers from the portion of the plurality of hard mask lines not covered by the second resist.

2. The method of claim 1, wherein performing the dry etch process forms a semiconductor device precursor having the width of the sidewall spacers associated with at least one of the plurality of hard mask lines substantially different from the width of sidewall spacers associated with another hard mask line.

3. The method of claim 1, wherein performing the dry etch process forms a semiconductor device precursor having the width of the sidewall spacers associated with at least one of the plurality of hard mask lines different from the width of sidewall spacers associated with another hard mask line by about 4 nm or more.

4. The method of claim 1, wherein performing the dry etch process forms a semiconductor device precursor having the width of the sidewall spacers associated with at least one of the plurality of hard mask lines different from the width of sidewall spacers associated with another hard mask line from about 5 nm to about 35 nm.

5. The method of claim 1, wherein the width of sidewall spacers associated with a first hard mask line is about 5 nm or more narrower than the width of sidewall spacers associated with a second hard mask line, wherein a third hard mask line has substantially no associated sidewall spacers.

6. The method of claim 1, further comprising contacting the gate material layer with an etchant to form gate lines and the semiconductor device has the width of at lest one gate line different from the width of another gate line by about 5 nm or more.

7. The method of claim 6, wherein contacting of the gate material with an etchant forms a semiconductor device having the width of at lest one gate line different from the width of another gate line from about 5 nm to about 35 nm.

8. The method of claim 1, wherein the widths of the plurality of hard mask lines are substantially equal.

9. The method of claim 1, wherein the width of sidewall spacers associated with a first hard mask line is about 5 nm to about 25 nm narrower than the width of sidewall spacers associated with a second hard mask line.

10. The method of claim 2, wherein the width of sidewall spacers associated with a first hard mask line is about 5 nm to about 25 nm narrower than the width of sidewall spacers associated with a second hard mask line.

11. The method of claim 2, wherein the widths of the plurality of hard mask lines are substantially equal.

12. A method for forming a semiconductor device having transistors with targeted CDs, comprising:
    providing a semiconductor device comprising a hard mask layer formed over a gate material layer, wherein the hard mask layer is formed into a plurality of hard mask lines and a layer of spacer material formed over the plurality of hard mask lines;
    covering a first portion of the plurality of hard mask lines with a first resist;
    performing a wet etch process on the semiconductor device having the first portion of the plurality of hard mask lines covered with a first mask;
    removing the first resist from the first portion of the plurality of hard mask lines;
    performing a first dry etch process to remove a portion of the spacer material, wherein the remaining spacer material adheres to the sides of the plurality of hard mask lines to form sidewall spacers;
    after performing the first dry etch, covering a second portion of the plurality of hard mask lines and associated spacer sidewalls with a second resist and performing a second dry etch to remove substantially all of sidewall spacers from the portion of the plurality of hard mask lines not covered by the second resist; and
    contacting the gate material layer with an etchant to form gate lines.

13. The method of claim 12, wherein performing the dry etch process forms a semiconductor device precursor having the width of the sidewall spacers associated with at least one of the plurality of hard mask lines substantially different from the width of sidewall spacers associated with another hard mask line.

14. The method of claim 12, wherein performing the dry etch process forms a semiconductor device precursor having the width of the sidewall spacers associated with at least one of the plurality of hard mask lines different from the width of sidewall spacers associated with another hard mask line by about 5 nm or more.

15. The method of claim 12, wherein the semiconductor device has the width of at lest one gate line different from the width of another gate line by about 5 nm or more.

16. The method of claim 15, wherein contacting of the gate material with an etchant forms a semiconductor device having the width of at lest one gate line different from the width of another gate line from about 5 nm to about 35 nm.

17. The method of claim 12, wherein the widths of the plurality of hard mask lines are substantially equal.

18. The method of claim 13, wherein the widths of the plurality of hard mask lines are substantially equal.

19. A method for forming a semiconductor device having transistors with targeted CDs, comprising:
   providing a semiconductor device comprising a hard mask layer formed over a gate material layer, wherein the hard mask layer is formed into a plurality of hard mask lines and a layer of spacer material formed over the plurality of hard mask lines;
   covering a first portion of the plurality of hard mask lines with a first resist;
   performing a wet etch process on the semiconductor device having the first portion of the plurality of hard mask lines covered with a first mask;
   removing the first resist from the first portion of the plurality of hard mask lines;
   performing a first dry etch process to remove a portion of the spacer material, wherein the remaining spacer material adheres to the sides of the plurality of hard mask lines to form sidewall spacers; and
   after performing the first dry etch, covering a second portion of the plurality of hard mask lines and associated spacer sidewalls with a second resist and performing a second dry etch to remove substantially all of sidewall spacers from the portion of the plurality of hard mask lines not covered by the second resist,
   wherein the semiconductor device has the width of at lest one gate line different from the width of another gate line by about 5 nm or more.

20. The method of claim 19, wherein the widths of the plurality of hard mask lines are substantially equal.

* * * * *